United States Patent [19]

Sugino et al.

[11] Patent Number: 5,287,284
[45] Date of Patent: Feb. 15, 1994

[54] PRODUCT SPECIFICATION COMPLEX ANALYSIS SYSTEM

[75] Inventors: Kazuhiro Sugino, Yokohama; Shingo Akasaka, Zushi; Hiroko Imanishi; Junichi Saeki, both of Yokohama; Kunihiko Nishi, Kokubunji; Asao Nishimura, Ushiku, all of Japan

[73] Assignee: Hitachi, Ltd., Tokyo, Japan

[21] Appl. No.: 792,160

[22] Filed: Nov. 14, 1991

[30] Foreign Application Priority Data

Nov. 14, 1990 [JP] Japan ................. 02-306153
Nov. 30, 1990 [JP] Japan ................. 02-328908

[51] Int. Cl.$^5$ ............................................. G06F 15/46
[52] U.S. Cl. .................................... 364/468; 364/401; 364/491
[58] Field of Search ............... 364/468, 476, 488–491, 364/578, 401–403; 395/919

[56] References Cited

U.S. PATENT DOCUMENTS

| 4,796,194 | 1/1989 | Atherton | 364/468 |
| 4,887,206 | 12/1989 | Natarajan | 364/468 X |
| 4,989,166 | 1/1991 | Akasaka et al. | |
| 5,101,352 | 3/1992 | Rembert | 364/468 X |
| 5,105,362 | 4/1992 | Kotani | 364/468 |
| 5,119,307 | 6/1992 | Blaha et al. | 364/468 |

OTHER PUBLICATIONS

"Die Technology . . . Plastic Injecting Molding Die Design Data Book . . . ", vol. 2, No. 11, Chapter 2, pp. 16–19, Nissan Kogyo Shimbunsha; Oct. 20, 1987.
"A System with Model Formulation Capabilities for Fluid Flow Analysis of Plastic Molds", MSET 21, The International Conference on Manufacturing Systems and Environment; May 28–Jun. 1, 1990, pp. 211–216; Sugino et al.
Saeki et al–"Flow Analysis of an Epoxy Compound for Low-Pressure Transfer Molding in a Circular Cross-Sectional Channel"–JSME International Journal Series II, vol. 33, No. 3, 1990 pp. 486–493.
Kitano et al–"Analysis of Package Cracing During Reflow Soldering Process"–1988 IEEE/IRPS; pp. 90–95; Proc. 26th International Reliability Physics Symposium, 1988.

*Primary Examiner*—Joseph Ruggiero
*Attorney, Agent, or Firm*—Antonelli, Terry Stout & Kraus

[57] ABSTRACT

A product specification complex analysis system is provided which inputs product specifications of an external form and materials, design parameters determined by analysis and evaluation in the specifications, the range of the change of the parameters and a plurality of items of estimates as external input data, calls out and executes an evaluation program corresponding to each item of the estimates and stored in advance, from a group of evaluation programs whenever the item of the estimates is renewed, in order to sequentially evaluate the product specifications for each item of the estimates, determines the fluctuation of analysis results with respect to the change of the design parameters within designated ranges of changes, evaluates trade-off between the analysis results by changing the design parameters from the analysis results corresponding to the items of the estimates so as to make maximal evaluation values in an evaluation formula as an estimate function with weights comprising each of these analysis results, and can thus obtain optimum design parameters.

12 Claims, 16 Drawing Sheets

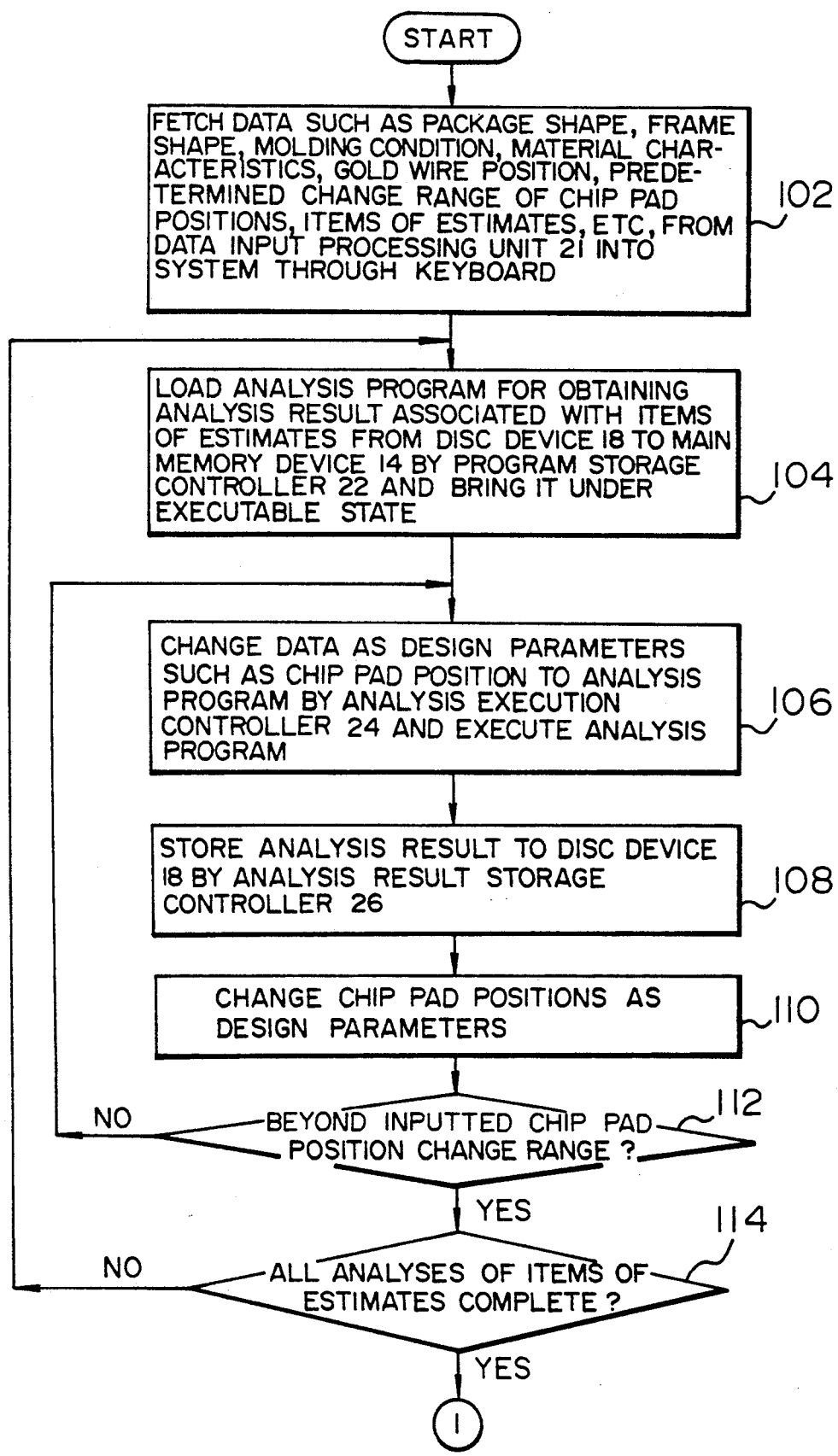

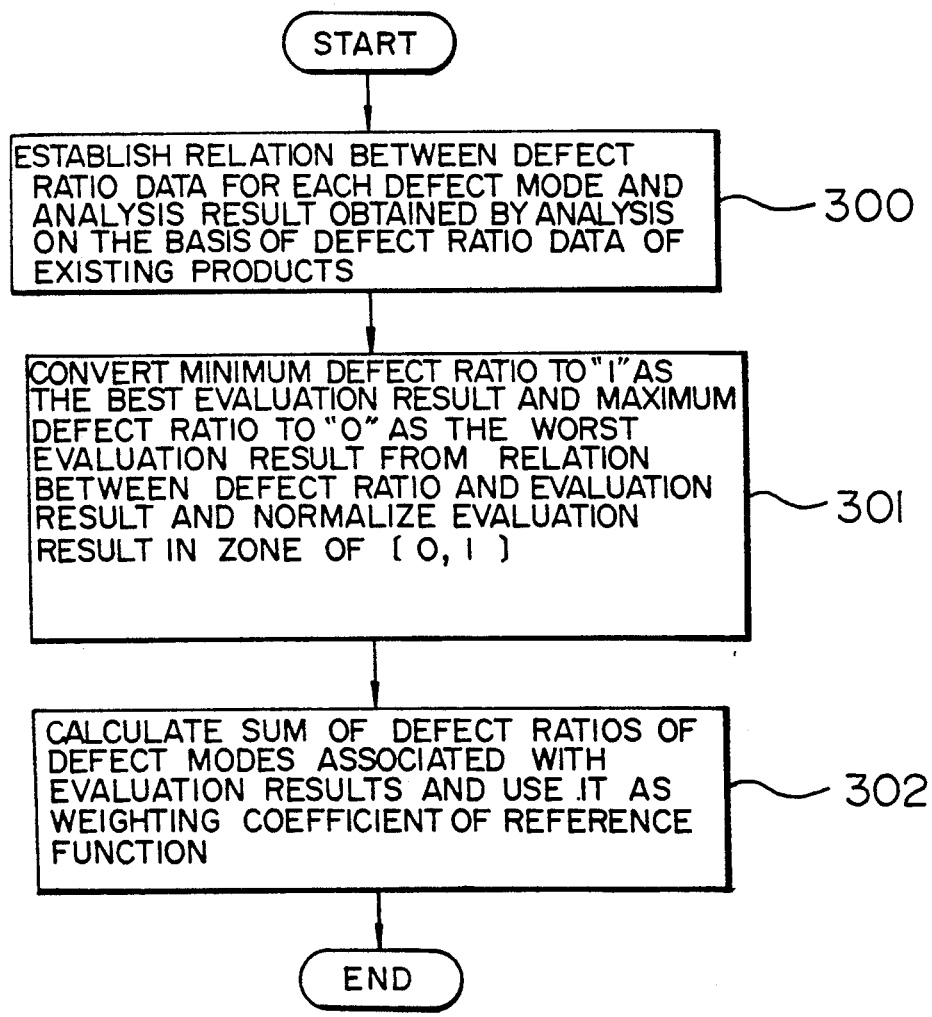

$$f(x) = -\frac{D(G(x)) - D_{max}}{D_{max} - D_{min}}$$

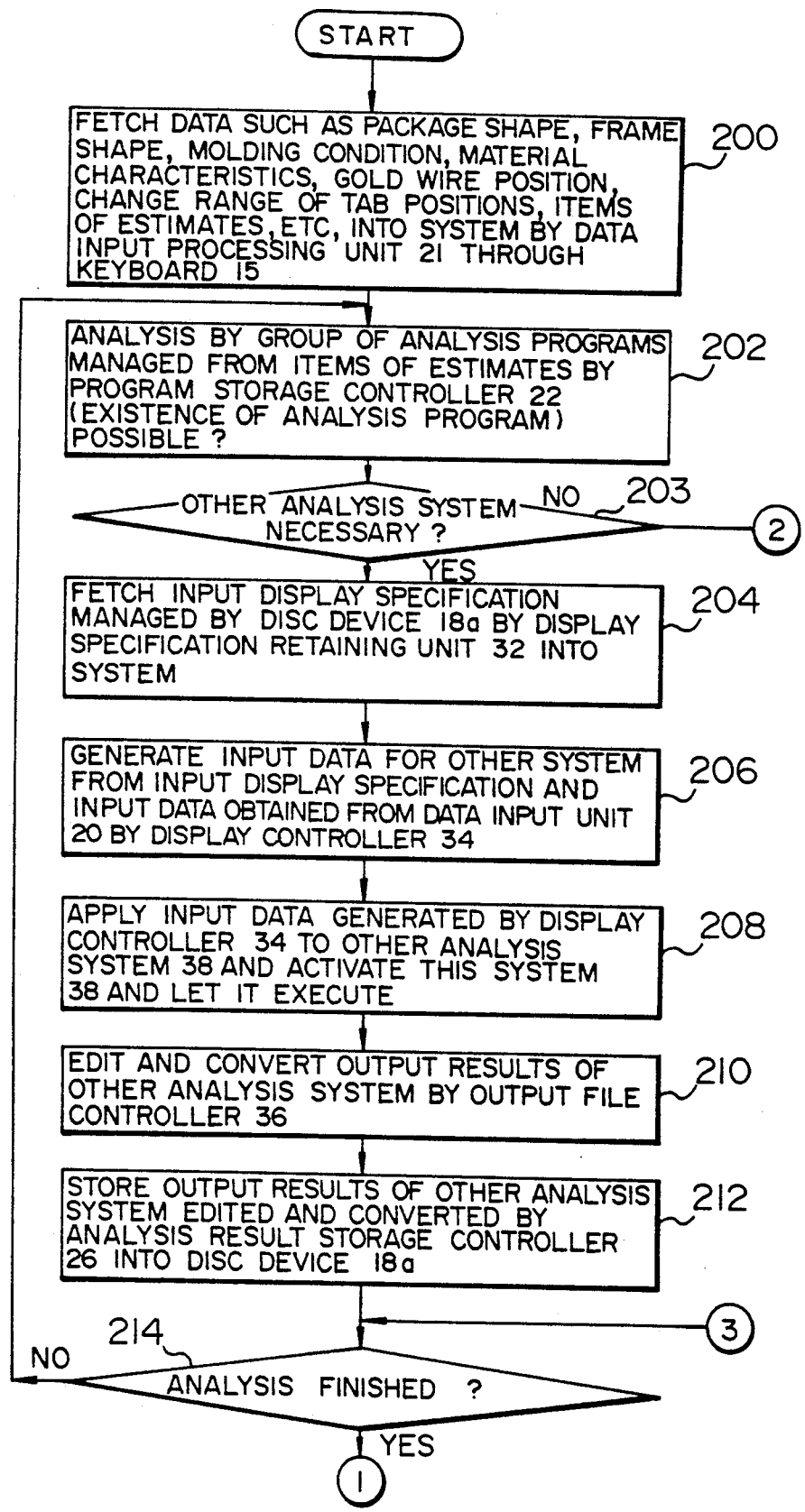

PRODUCT SPECIFICATION COMPLEX ANALYSIS SYSTEM

BACKGROUND OF THE INVENTION

This invention relates to a product specification complex analysis system which obtains optimum product specification values when product specifications are designed, by collectively analyzing and evaluating the design specifications from a plurality of aspects such as the aspect of reliability during use of products, the aspect of processability, the aspect of operability, and so forth.

A large number of analysis methods or analysis systems for evaluating and determining product specifications have been announced in the past. For example, an analysis system for effecting flow analysis, cooling analysis, etc, for designing a molding die is discussed in "Die Technology—Plastic Injection Molding Die Design Data Book—", Vol. 2, No. 11, chapter 2, pp. 16-19 (published by Nikkan Kogyo Shimbunsha, Oct. 20, 1987). According to this prior art, flow analysis, heat transfer analysis, structure analysis, and so forth, are sequentially carried out for designing a molding die and the product specifications are merely confirmed by the individual analysis results.

However, according to these conventional analysis methods or analysis systems, the design specifications are merely confirmed by the individual analysis results. Though the molding die itself is a kind of jigs for molding products, the analysis results when the product specifications are analyzed should originally be compared with the analysis result of the die specifications, but the prior art technology has failed to make collective judgement by combining and uniting the analysis results from a plurality of different aspects.

In other words, since the prior art technology involves the following various drawbacks, the product specifications cannot be determined by the evaluation based on a plurality (at least two kinds) of different aspects.

① Specific analysis or analyses are conducted with a high level of accuracy (to yield accurate calculation results for an assumed model) and the analysis results are merely displayed graphically. Therefore, collective evaluation based on the correlation between the analysis results cannot be made.

② If collective evaluation is based on a common scale of evaluation, analysis results cannot be evaluated from different aspects.

③ Compatibility or the common use of a data base has been accomplished so as to carry out a plurality of analyses as a series of analyses, but evaluation of each analysis result is entirely left to the judgement of users. Moreover, the methods or systems do not support the users' judgement on a plurality of analysis results.

SUMMARY OF THE INVENTION

It is therefore the first object of the present invention to provide a product specification complex analysis system which can decide product specification values to optimum values by collective judgement based on analysis results obtained from two or more different aspects.

It is the second object of the present invention to provide a product specification complex analysis system which can decide product specification values to optimum values by collective judgement based on analysis results obtained at least from the aspect of reliability of product specifications, the aspect of processability during production and operability during production.

It is the third object of the present invention to provide a product specification complex analysis system which facilitates data processing for effecting complex analysis and can decide product specification values to optimum values by collective judgement based on analysis results obtained from at least two or more different aspects.

It is the fourth object of the present invention to provide a product specification complex analysis system which facilitates data processing for effecting complex analysis, and can decide product specification values to optimum values by collective judgement based on analysis results on a common scale obtained from two or more different kinds of aspects.

It is the fifth object of the present invention to provide a product specification complex analysis system which can decide product specification values to optimum values by flexible and collective judgement based on analysis results obtained from two or more different kinds of aspects when complex analysis is carried out.

It is the sixth object of the present invention to provide a product specification complex analysis system which can decide product specification values to optimum values even when analysis result or results cannot be obtained for certain items of estimates by the analysis system of its own.

It is the seventh object of the present invention to provide a product specification complex analysis system which facilitates data processing for effecting complex analysis even when analysis result or results for certain items of estimates cannot be obtained by the analysis system of its own, and can decide product specification values to optimum values by flexible and collective judgement based on analysis results on a common scale obtained at least from the aspects of reliability of product specifications, processability during production and operability during production.

The first object described above can be accomplished by the system configuration wherein product specifications such as an external form, materials, etc, design parameters determined in the product specifications by analysis and evaluation, the range of the change of the parameters and a plurality of items of estimates are used as external input data; an evaluation program corresponding to each item of estimates are called out from a group of evaluation programs stored in advance and is executed whenever the item of estimate is renewed, in order to sequentially evaluate the product specification for each item of estimate, and thus to determine the change of the analysis result in accordance with the change of the design parameters within a designated range of change; and trade-off between the analysis results is evaluated by changing the design parameters from the analysis results corresponding to the items of estimates in such a manner as to make maximum the evaluation value of an evaluation formula as an estimate function with weights comprising each of these analysis results, and thus to obtain optimum design parameters.

The second object described above can be accomplished by including at least items of estimates associated with the aspect of reliability of product specification, the aspect of processability during production and the aspect of operability during production in the items of estimates.

The third object described above can be accomplished by effecting polynomial approximation of the analysis results corresponding to the items of estimates.

The fourth object described above can be accomplished by normalizing the analysis results corresponding to the items of estimates subjected to polynomial approximation so that they are within the range of specific values. More definitely, when the analysis results corresponding to the items of estimates subjected to polynomial approximation are normalized so that they fall within the zone of [0, 1], the correlationship between an evaluation result and a defect ratio is determined on the basis of defect data of existing products or products that have been already developed, the best evaluation result is converted to "1" with the worst being "0" when the defect ratio is minimum and maximum, respectively, and the sum of the defect ratio for each defect mode associated with each analysis result is used as a weighting coefficient.

The fifth object described above can be accomplished by renewing the weight corresponding to the analysis result when trade-off between the analysis results is evaluated by changing the design parameters so as to make the evaluation value maximum in an evaluation formula as an estimate function with weights, from the analysis results corresponding to the items of estimates.

The sixth object can be accomplished by transferring a certain evaluation program corresponding to a certain item of estimates to another external analysis system and analyzing it when such an evaluation program does not exist in a group of evaluation programs stored in advance, and fetching the analysis result as the analysis result corresponding to the item of estimates, into own analysis system.

The seventh object can be accomplished by using product specifications such as an external form, materials, etc, design parameters determined by analysis and evaluation in these product specifications, the range of change of these parameters and items of estimates at least from the aspect of reliability of product specifications, processability during production and operability during production as external input data; calling out an evaluation program corresponding to the item of estimate from a group of evaluation programs stored in advance whenever the item of estimates is renewed so as to sequentially evaluate the product specifications for each item of estimates; executing the evaluation program thus called so as to determine the change of the analysis results with respect to the change within the designated change range of the design parameters; determining the correlation between the evaluation result and a defect ratio on the basis of defect data of existing products when normalization is made so that the analysis result corresponding to each item of estimates, which is subjected to polynomial approximation, falls within the zone of [0, 1]; converting the best and worst results of the evaluation results to "1" and "0" when the defect ratio is minimum and maximum, respectively; using the sum of the defect ratio for each defect mode associated with each analysis result as a weighting coefficient; making renewable the weight corresponding to the analysis result so that the evaluation value in the evaluation formula as an estimate function with weights comprising each analysis result becomes maximum; evaluating trade-off between the analysis results by changing the design parameters to obtain optimum design parameters; transferring data necessary for the analysis of a certain item of estimates to other external analysis system to let it analyze the data when an evaluation program corresponding to the certain item of estimate does not exist in the group of evaluation programs in advance stored; and fetching the analysis result into own analysis system as the evaluation result corresponding to the item of estimates.

In other words, when various specifications of products are designed, product specifications such as an external form, materials, etc, design parameters that are determined by analysis and evaluation in the product specifications, the range of change of these parameters and a plurality of items of estimates are used as external input data so as to conduct composite analysis of the product specifications. Whenever the item of estimates is renewed so as to sequentially evaluate the product specifications for each item, an evaluation program corresponding to each item of estimates is executed so as to determine the change of the analysis result corresponding to the change of the design parameters within the designated range of change. Thereafter, when trade-off between the analysis results is evaluated by changing the design parameters so that the evaluation value in the evaluation formula as an estimate function with weights becomes maximum, from the analysis results corresponding to these items of estimates, the optimum design parameters can be obtained eventually. In this case, if the evaluation items associated with the aspects of reliability of design specifications, processability during production and operability during production are included as the most important items in the items of estimates, the product specification values can be determined to the optimum values by the collective judgement based on the evaluation results obtained from these aspects.

In this case, if each of the analysis results corresponding to the items of estimates is polynominally approximated, normalized and optimized, data processing becomes easier and the product specification values can be determined to the optimum values. Moreover, when the weight in the estimate function with weights is renewed, the product specification values can be determined with flexibility to the optimum values.

If the evaluation program corresponding to a certain item(s) of estimates does not exist inside own analysis system when the system makes complex analysis of the product specifications, the analysis result corresponding to such an item(s) of estimates can be obtained by utilizing other external analysis system. The data required for the analysis of that item of estimates are transferred to the other external analysis system and analyzed by the latter, and the result of this analysis is fetched into own analysis system as the evaluation result corresponding to the item of estimates.

BRIEF DESCRIPTION OF THE DRAWINGS

FIGS. 1A, 1B and 1C are flowcharts showing the processing procedures when a product specification complex analysis system of the present invention are applied to the design of a plastic-encapsulated package of semiconductor device;

DESCRIPTION OF THE PREFERRED EMBODIMENTS

Hereinafter, the present invention will be explained with reference to FIGS. 1 to 13.

Figure 2:
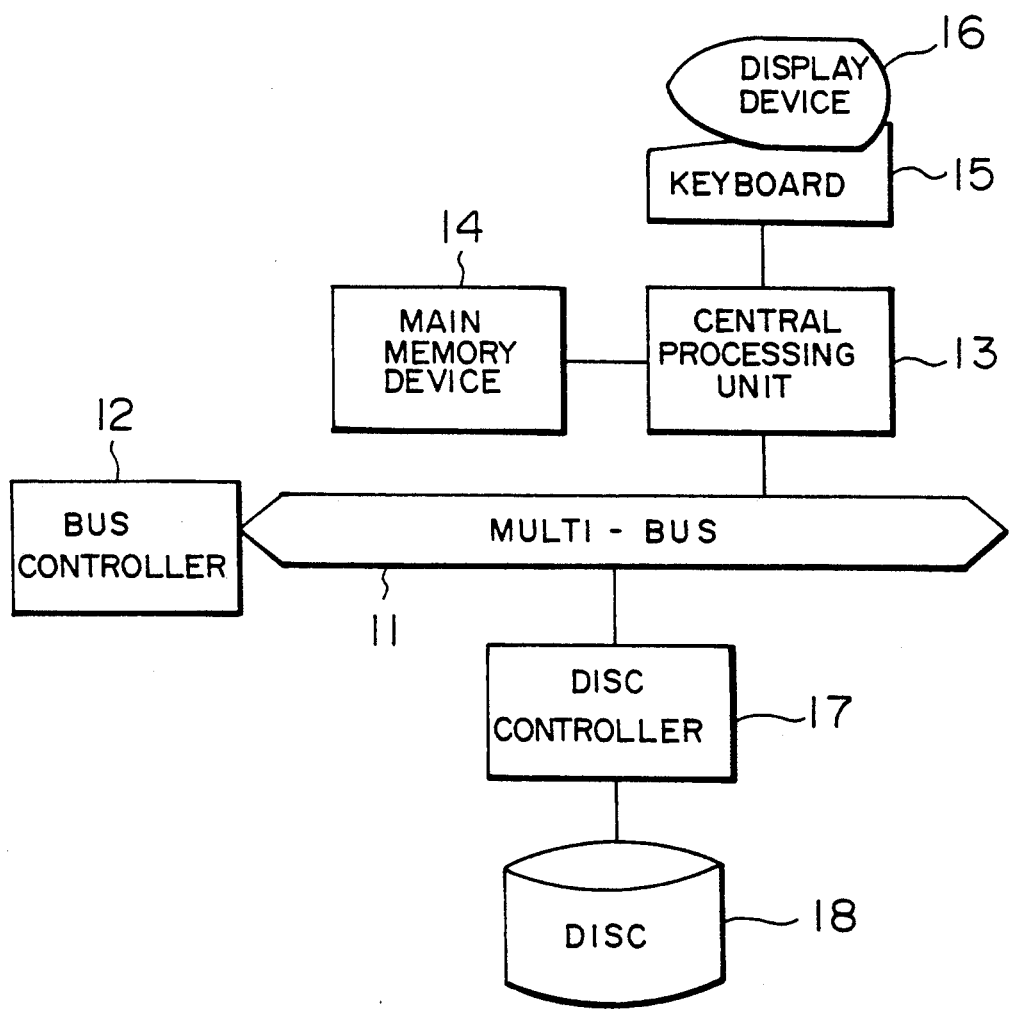
FIG. 2 is a structural view showing a hardware configuration of the product specification complex analysis system of the present invention.
Figure 3:
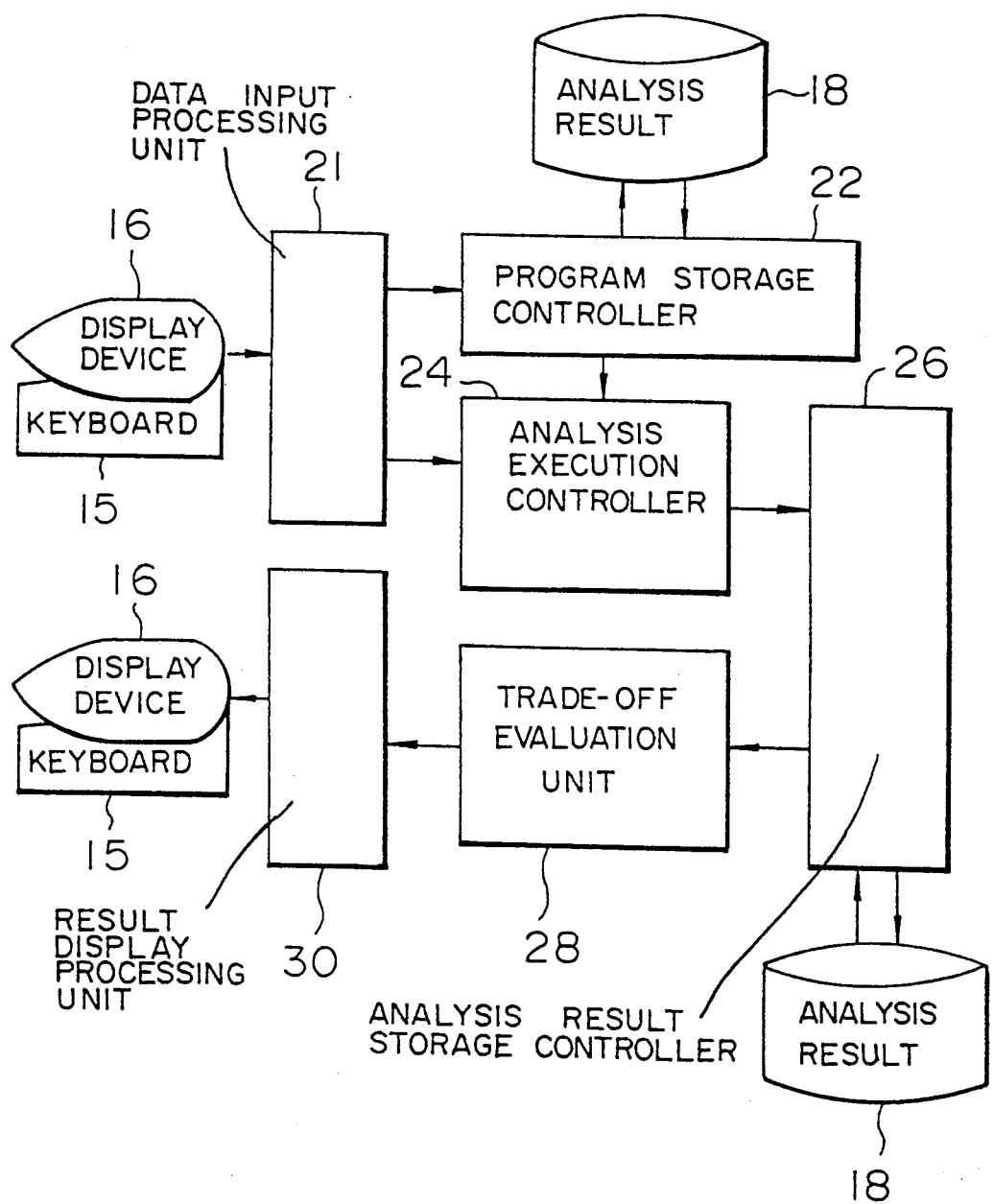
FIG. 3 is a functional block diagram showing an example of software configuration of the product specification complex analysis system of the present invention.

To begin with, a fundamental product specification complex analysis system in accordance with the present invention will be explained. FIG. 2 shows typically a hardware configuration of the product specification complex analysis system of the present invention and FIG. 3 shows typically its software configuration. In the complex analysis system shown in FIG. 2, a disc device 18 is stored through a disc controller 17 in a multi-bus 11 which is under the control of a bus controller 12, besides a central processing unit 13. A main memory device 14, a display device 16 and a keyboard 15 are stored in the central processing unit 13. The data inputted from the keyboard 15 is stored by the central processing unit 13 into the main memory device 14 and at the same time, is displayed on the display device 16. The data in the main memory device is transferred by the central processing unit 13 to the disc device 18 through the multi-bus 11 and to the disc controller 17 and in this way, data exchange is accomplished.

From the software aspect, the system is so constituted as to include processing/controlling softwares such a data input processing unit 21, a program storage controller 22, an analysis execution controller 24, an analysis result storage controller 26, a trade-off evaluation unit, and a result display processing unit 30, as shown in FIG. 3.

Figure 1B:
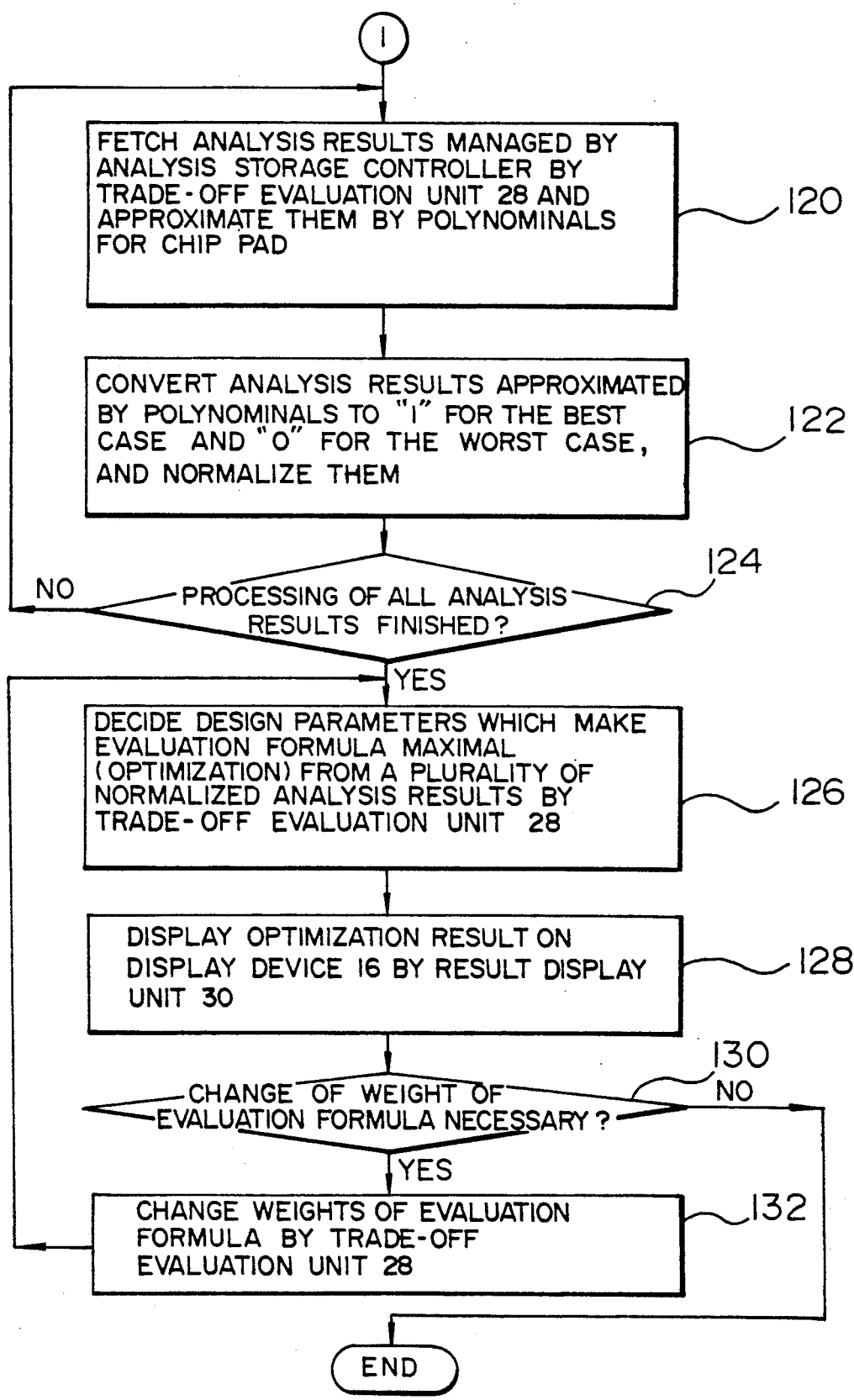

The product specification complex analysis system in accordance with the present invention will be explained about the case where it is applied to the design of a plastic-encapsulated package of a semiconductor device, by way of example, and its processing flow is shown in FIGS. 1A, 1B and 1C. Incidentally, this embodiment assumes the case where the position design of chip pads (metal plates for supporting a chip) of the plastic-encapsulated package of a semiconductor device is carried out from the aspect of reliability during reflow soldering at the time of PCM (Printed Circuit Board) mounting and from the aspect of moldability during a molding process.

First of all, an operator inputs data such as a package shape, a frame shape, a molding condition, material characteristics, a gold wire position, the range of changes of tab positions, items of the estimates (stress analysis, flow analysis), etc, from a keyboard 15. These data are taken into the complex analysis system as the external input data from the data input processing unit 21 (processing 102). Next, the program storage controller 22 judges the analysis program which is necessary for the complex analysis, on the basis of the items of the estimates from the data input processing unit 20. The necessary analysis program is selected from a group of analysis programs stored in advance in the disc device 18 and is loaded into the main memory device 14 through the disc controller 17 and the central processing unit 13 (processing 104).

To execute the analysis program thus loaded, the analysis execution controller 24 converts the data such as the package shape, the frame shape, the material characteristics, the gold wire position, chip pad positions, etc, from the data input processing unit 20 to the form that can be inputted to the analysis program, and then the analysis program is executed (processing 106). The analysis result can be obtained when this analysis program is executed. The analysis result storage controlling unit 26 stores the analysis result obtained from the analysis execution controller 24 into the disc device 18 through the main memory device 14, the central processing unit 13, the multi-bus 11 and the disc controller 17 (processing 108). Next, the analysis execution controller 24 changes the chip pad position as one of the design parameters (processing 110) and if the chip pad position after this change is within the change range of the chip pad position as the allowable design range of the chip pad position to be in advance inputted to the system (processing 112), the analysis program is executed once again while data other than the chip pad position data are regarded as being the same, and the analysis result as the execution result is stored in the disc device 18 by the analysis result storage controller 26. So long as the tab position after the change exists within the change range of the chip pad position, the execution of the analysis program is repeated, but if the chip pad position after the change exceeds the change range, the flow shifts to the next step.

At the next step, whether or not all the analysis results relating to the items of the estimates from the data input processing unit 20 are obtained is judged by the analysis execution controller 24 (processing 114). If the analysis results of all the items of the estimates are not yet obtained, the analysis program or programs corresponding to such items of the estimates are loaded from the disc device 18 into the main memory device 14 by the analysis execution controller 24 through the program storage controller 22, and the execution of the analysis program or programs is likewise repeated.

Figure 4A:
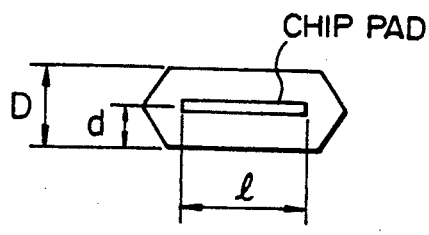
FIG. 4A is an explanatory sectional view of a plastic-encapsulated package of semiconductor device.
Figure 4B:
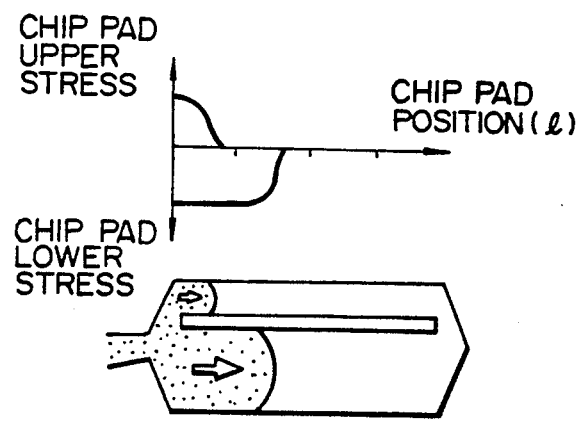
FIGS. 4B, 4C and 4D show in time series the upper/lower stress distribution acting on tip pads at the time of molding, by flow analysis of a resin.
Figure 4C:
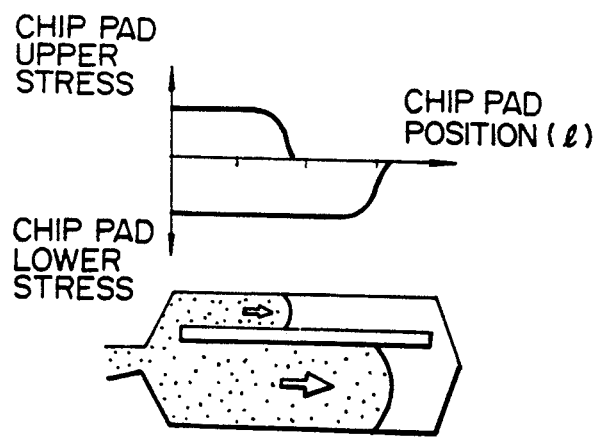
Figure 4D:
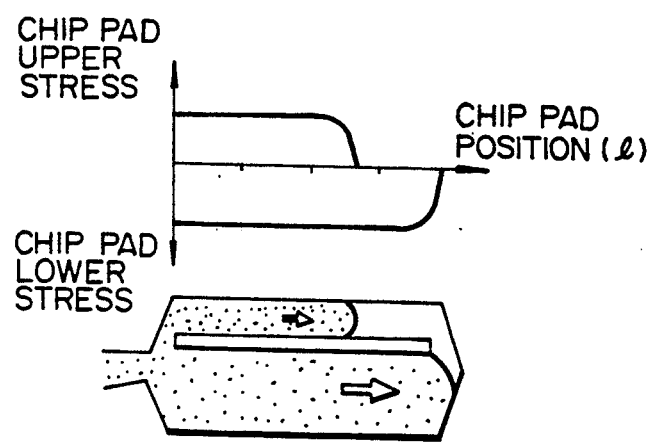
Figure 5:
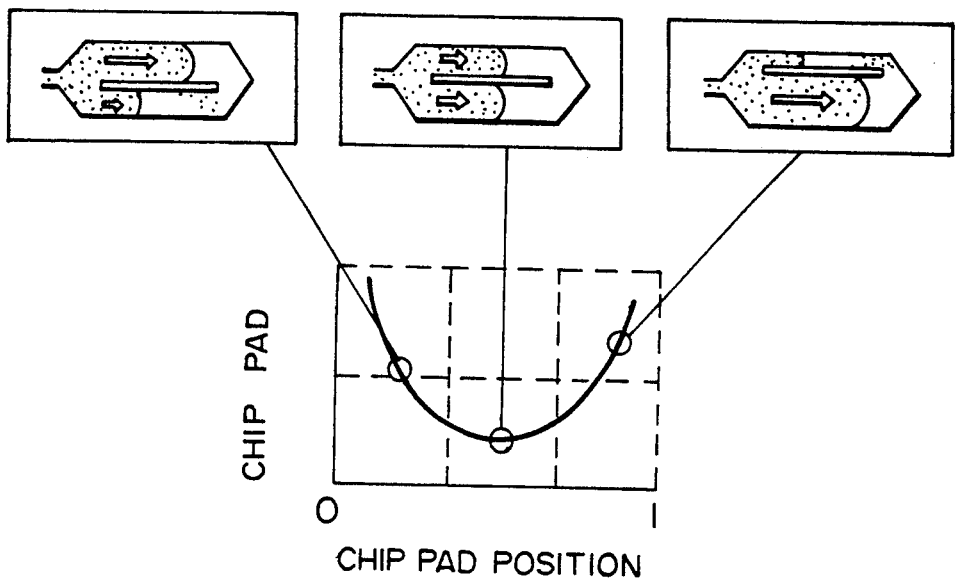
FIG. 5 is an explanatory view useful for explaining the relation between a deformation value of chip pad and a chip pad position determined from stress on upper/lower side of the chip pad in FIG. 4.
Figure 6:
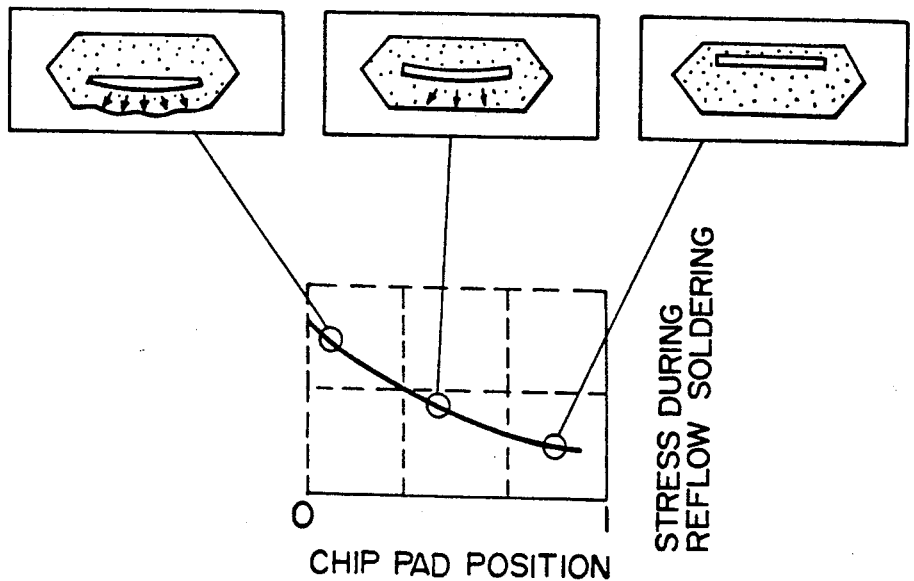
FIG. 6 is an explanatory view useful for explaining stress during reflow soldering in accordance with a chip pad position.

Here, the explanation will be given on the analysis result stored in the disc device 18 prior to the explanation of the processing sequence shown in FIGS. 1B and 1C. As shown in FIGS. 4 to 6, the contents of the result of analysis are the stress on the upper/lower side of the chip pad which is one of the design parameters and changes with the chip pad position, the chip pad, the stress during reflow soldering, and so forth. More in particular, FIG. 4A is a schematic view of the section of the plastic-encapsulated package of the semiconductor device, and FIGS. 4B to 4D show the upper/lower stress distribution acting on the chip pad (or the chip) during molding at three points in time series with the top of flow when flow analysis (simulation) is carried out. The chip pad shown in FIG. 5 is obtained by effecting strength analysis from the stress on the upper/lower side of the chip pad shown in FIG. 4. In the drawing, the chip pad position on the abscissa represents the chip pad height and is expressed by $x=d/D$ (d: constant) using the symbols shown in FIG. 4A. As can be understood from FIG. 5, too, the chip pad that the chip pad receives at the time of flow of the resin changes in accordance with the chip pad position h but when $d=D/2$, it can be understood that the chip pad is limited to the minimum value. Furthermore, FIG. 6 shows the chip pad stress during reflow soldering between the chip pad and the resin in accordance with the chip pad position x (the mean value of the stress at the corners which are regarded important in stress analysis during reflow soldering as the positions on which the stress concentrates).

Turning back again to FIGS. 1B and 1C, the processing sequence will be explained. In this processing sequence, the analysis result for the chip pad position change stored in the disc device 18 is taken into the trade-off evaluation unit 28 through the analysis result storage controller 26, and polynominal approximation, normalization and optimization (processings 120, 122, 124, 126) are sequentially carried out. In other words, in the polynominal approximation corresponding to each analysis result, a plurality of analysis results corresponding to the items of the estimates are approximated as the polynominals corresponding to the chip pad by the use of the method of least squares (processing 120).

$$G(X) = a_n X^n + a_{n-1} X^{n-1} + \ldots, + a_0 \quad (1)$$

where:
G(X) is analysis result, X is the deformation value of chip pad, and
ai (i=n, n−1, n−2, ..., 0): coefficient Since the analysis result is approximated by the polynominals to the items of the estimates as described above, the analysis result corresponding to an arbitrary chip pad can be obtained. Accordingly, the data obtained as the analysis result can be easily obtained while reducing the data processing on the analysis side, and hence, the design parameter (chip pad position) can be suitably selected by analysis, for example.

Next, in the trade-off evaluation unit 28 normalization is executed from the analysis result obtained by calculating the polynominals so that the analysis result falls within the range of a specific value. For example, conversion is made so that the best case corresponds to "1" and the worst case, to "0" and normalization is made so that the analysis result falls within the range of [0, 1] (processing 122).

This processing 122 will be explained in more detail with reference to the flowchart of FIG. 1C.

Figure 8:
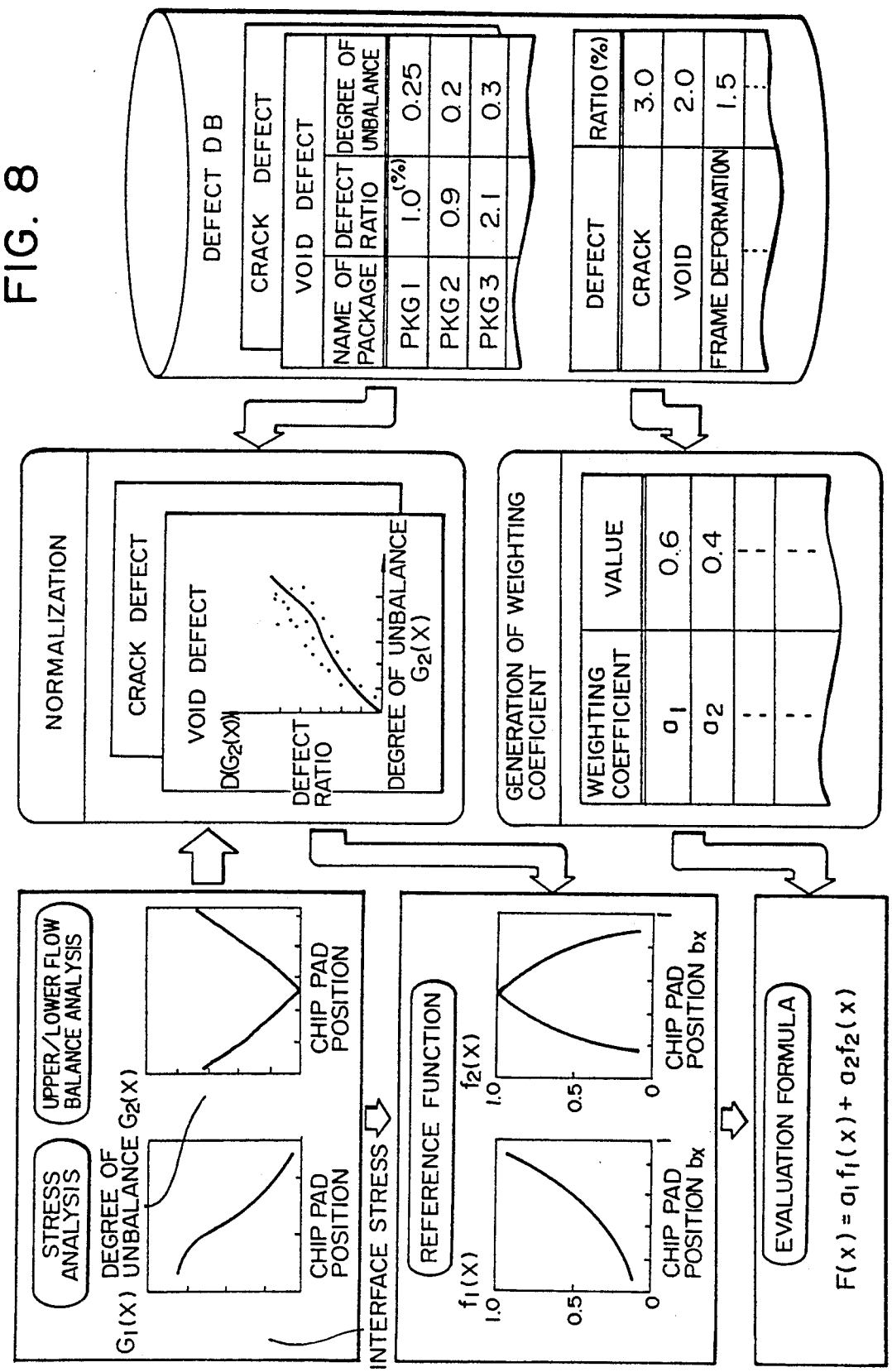
FIG. 8 is an explanatory view useful for explaining in detail a normalization processing.

Defect data of existing products are collected so as to prepare defect data base and the relationship between defect ratio data and the analysis result is determined on the basis of this defect data base (processing 300) as shown in FIG. 8. Then, conversion is made so that the minimum defect ratio corresponds to "0" and the maximum defect ratio, to "1" for normalization (processing 301), from the relationship between the defect ratio and the analysis result. Furthermore, the sum of the defect ratios of the defect mode associated with the analysis result is determined and is used as a weighting coefficient of a reference function of the analysis result (processing 302).

Figure 9:
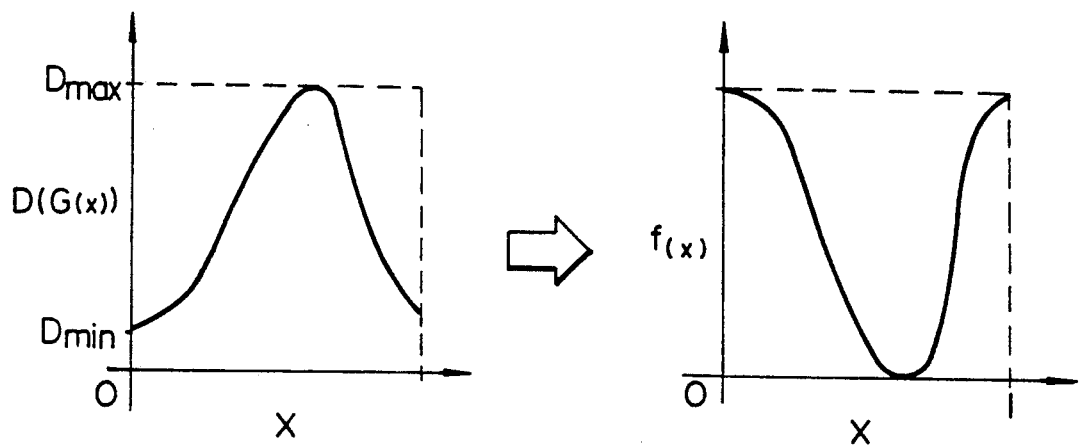
FIG. 9 is a diagram showing an conversion example of normalization processing.

The conversion method in this instance will be explained. As shown in FIG. 9, this conversion may be carried out as expressed by the following equation:

$$f(x) = -(D(G(x)) - D_{max})/(D_{max} - D_{min}) \quad (2)$$

where
f(x): conversion data
x: design parameter
$D_{max}$ maximum value of D(G(x))
$D_{min}$ minimum value of D(G(x))
G(x): analysis value In the manner described above, polynominalization and normalization are carried out for all the analysis results necessary for optimization (processing 124). Thereafter, the trade-off evaluation unit 28 executes optimization processing (processing 126) in order to obtain the design parameter (chip pad position) x which maximizes the evaluation formula F(x) expressed by equation (3) from a plurality of analysis results thus normalized.

$$F(x) = a_1 f_1(x) + a_2 f_2(x) + \ldots \quad (3)$$

where
fi(x): analysis result normalized
ai: weighting coefficient of fi(x)

Figure 7:
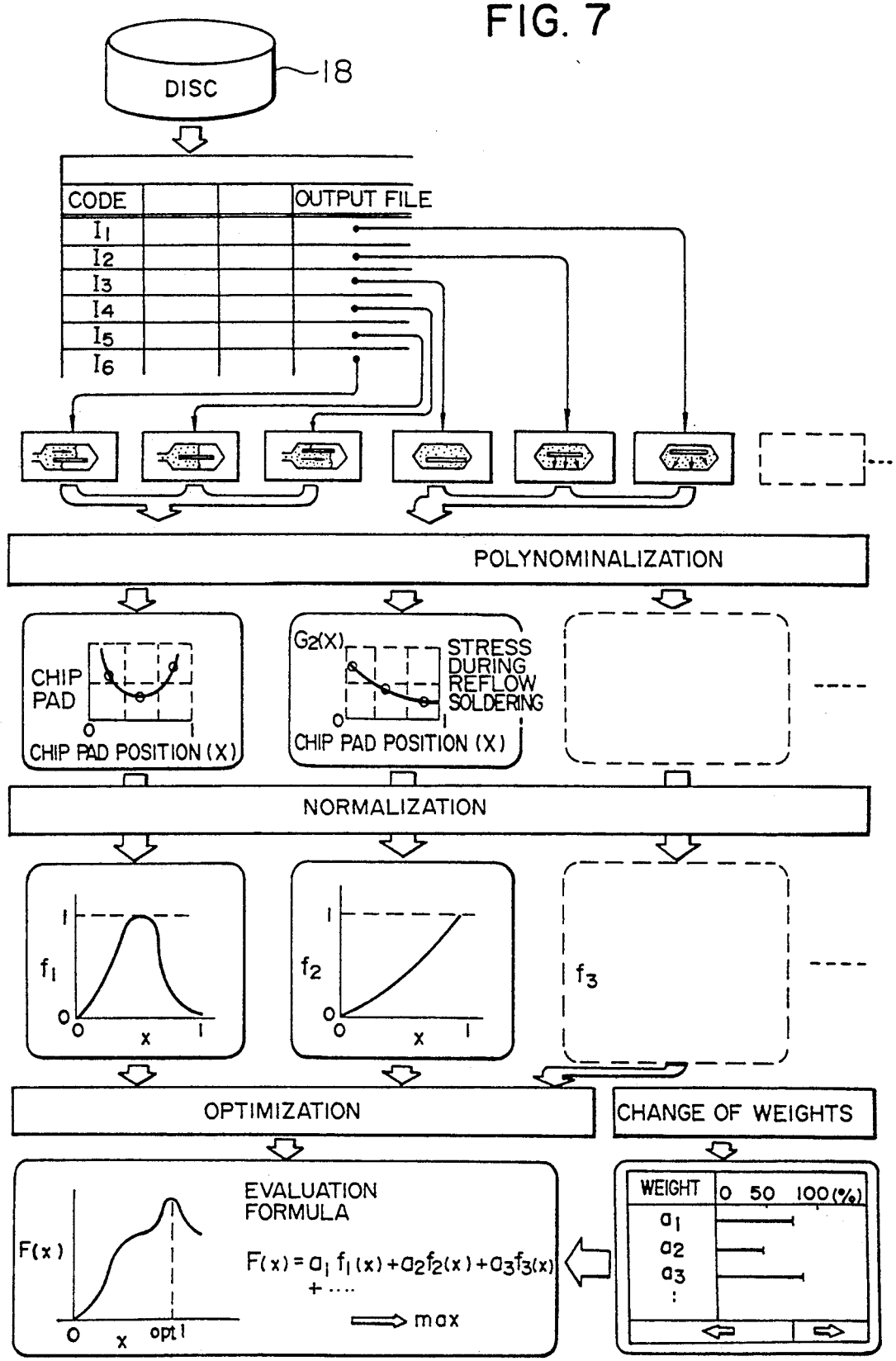
FIG. 7 is an explanatory view useful for explaining the concept of processing for polynominal approximation, normalization and optimization in the processing sequence of the product specification complex analysis system of the present invention.
Figure 10:
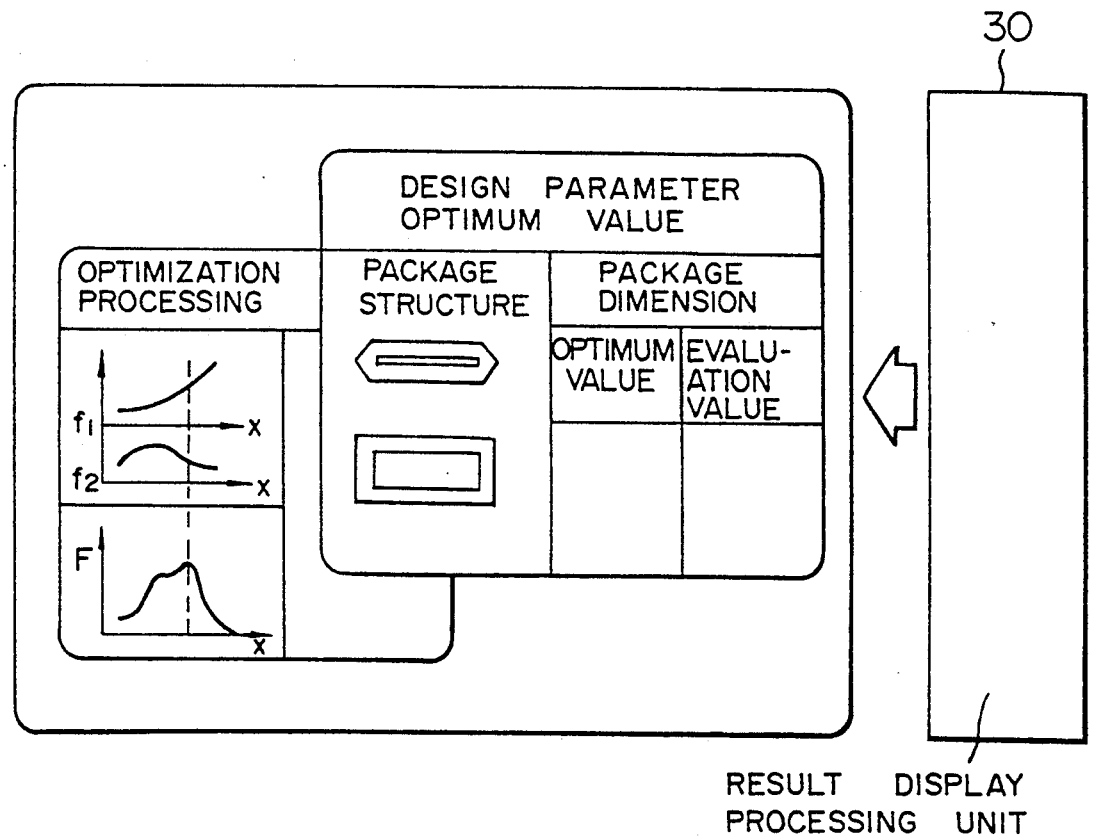
FIG. 10 is a diagram showing a display example of the processing result in the processing sequence in the product specification complex analysis system of the present invention.

Thereafter, the optimum value of the design parameter is displayed by the result display processing unit 30 on the display device 16 together with a graph representing the design parameter change of the evaluation value obtained by the trade-off evaluation unit 28, as shown in FIG. 10 (processing 128). The operator judges whether or not this design parameter value is reasonable on the basis of this display, and changes the weighting coefficient in the evaluation formula F(x), whenever necessary (processing 130). If the value of this design parameter is judged as reasonable, a series of operations and processings are completed but if it is judged unreasonable, the weighting coefficient in the evaluation formula F(x) is renewed (processing 132), and then the optimization processing is carried out once again to obtain the design parameter (tab position) x which maximizes the newly set evaluation formula F(x) (processing 126).

Where there is the possibility of the renewal of the weighting coefficient, the evaluation formula weight change display is displayed on the display device 16 as shown in FIG. 7 and the operator is required to change the weighting coefficient. When the operator requires the renewal in response to this request, the trade-off evaluation unit 28 executes the optimization processing on the basis of the estimate formula which is set anew (processing 126) and its result of processing is displayed on the display device 16 by the result display processing unit 30. The optimization processing is repeated, whenever necessary, until the design parameter value expected by the operator can be obtained. Finally, the satisfactory design parameter value is obtained.

As can be understood from the embodiment given above, the optimum parameter value can be obtained by carrying out the complex analysis estimates from the aspect of reliability of the product, from the aspect of moldability and operability during manufacture, and so forth, when the design of the plastic-encapsulated package of semiconductor devices is designed. Accordingly, the optimum design of the package as a whole can be obtained easily.

Next, another embodiment of the product specification complex analysis system of the present invention will be explained with reference to FIGS. 11 to 13.

Figure 11:
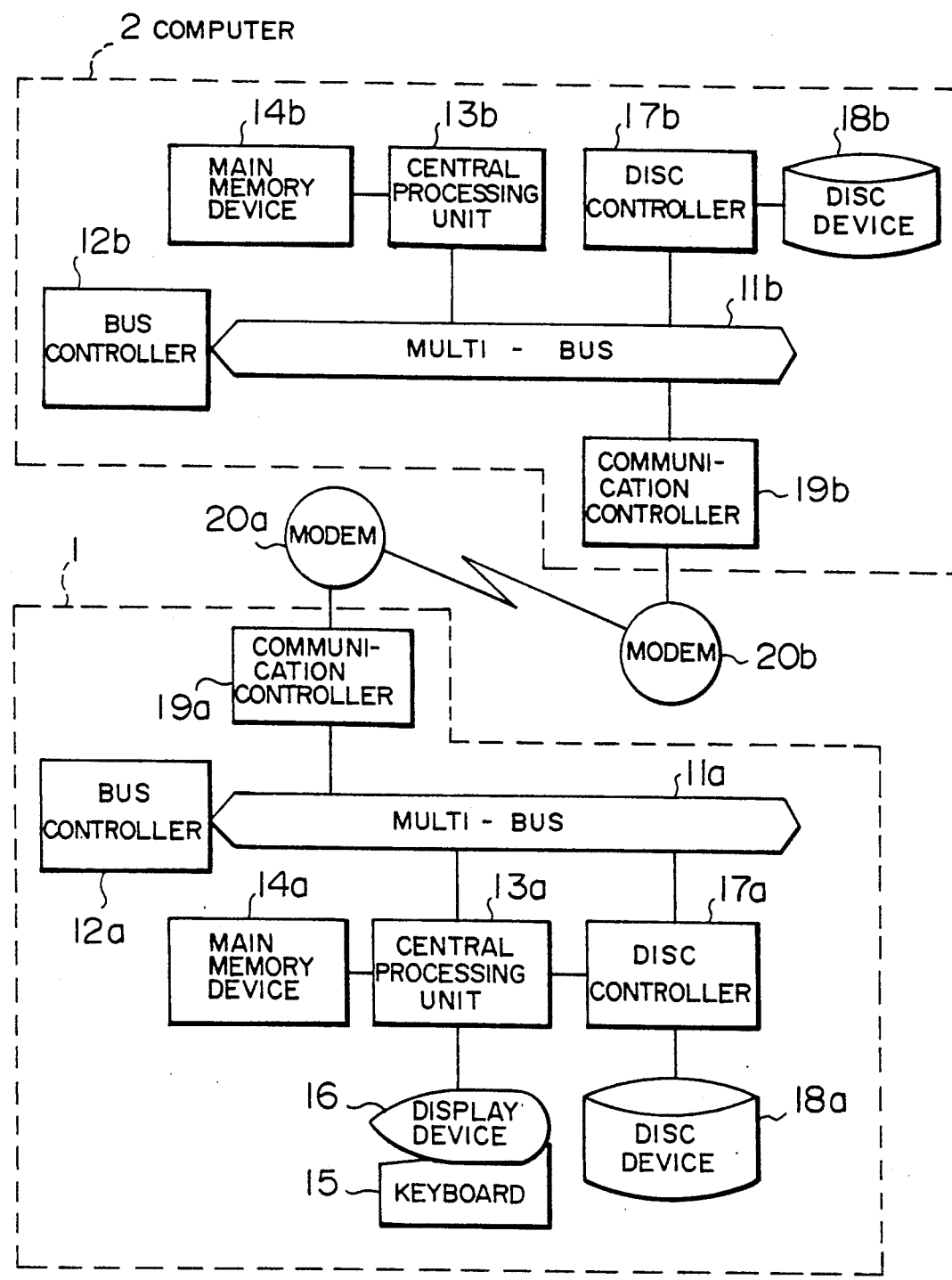
FIG. 11 shows another example of the hardware configuration in the product specification complex analysis system of the present invention.
Figure 12:
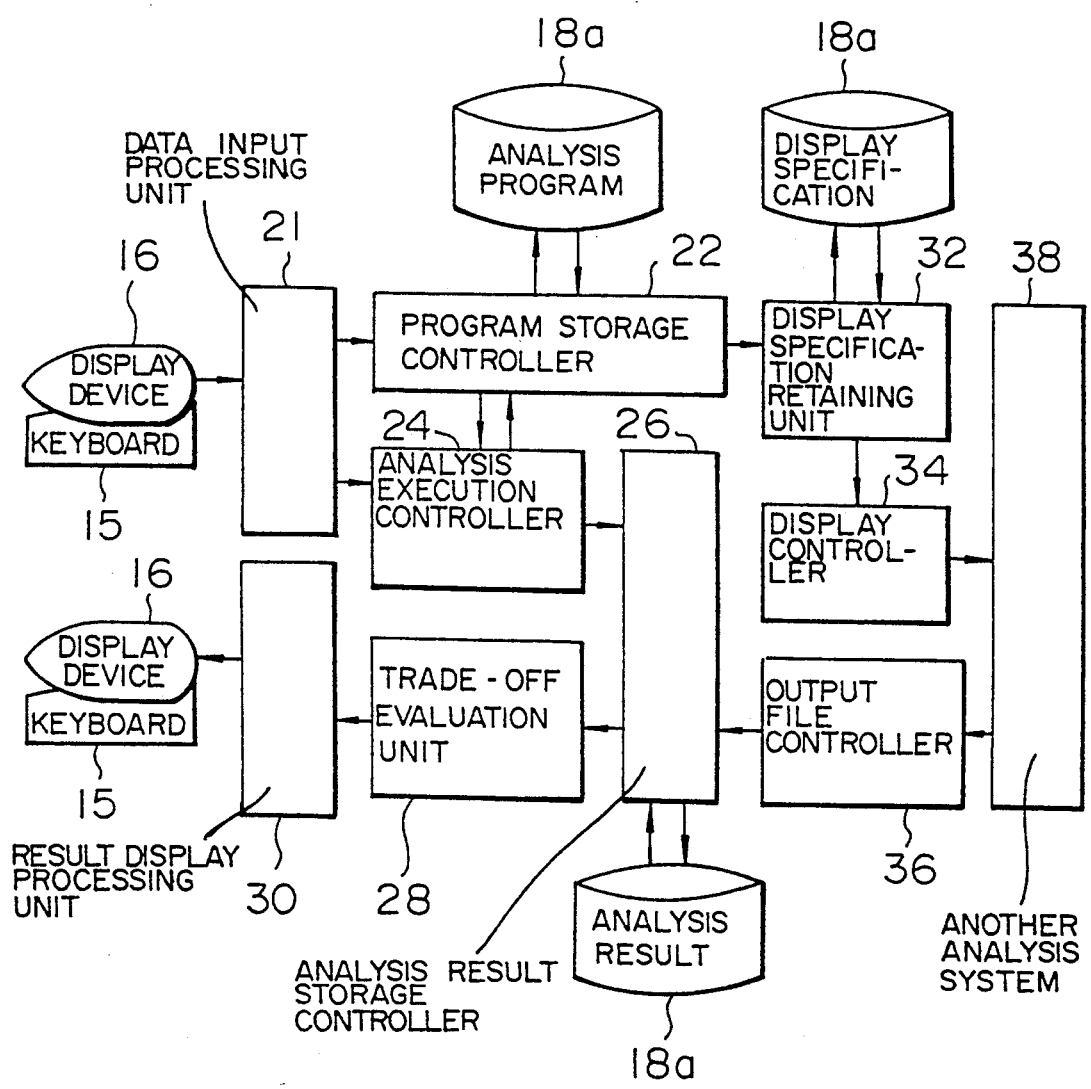
FIG. 12 shows another example of functional blocks associated with the software of the product specification complex analysis system of the present invention.

FIG. 11 shows the hardware configuration of the product specification complex analysis system in accordance with the present invention and FIG. 12 shows the software configuration. As shown in FIG. 11, the hardware configuration includes a work station 1 and a computer 2 that are connected to each other through MODEMs 20a and 20b. In the work station 1, a central processing unit 13a is connected to a multi-bus 11a, which is under the control of a bus controller 12a, a disc device 18a is connected to the multi-bus 11a through a disc controller 17a and furthermore, the MODEM 20a is connected to the multi-bus 11a through a communication controller 19a. The central processing unit 13a includes a main memory device 14a, a display device 16 and a keyboard 15. In the construction of the computer 2, on the other hand, a central processing unit 136 is connected to a multi-bus 11b which is under the control of a bus controller 12b. Similarly, a disc device 18b is connected to the multi-bus 11b through a disc controller 17b and a MODEM 20b is further connected to the multi-bus 11b through a communication controller 19b. The central processing unit 13b includes a main memory device 14b. Accordingly, the data from the keyboard 15 on the work station side 1 is stored in the main memory device 14a through the central processing unit 13a and at the same time, is displayed on the display device 16. The data of the main memory device 14a is stored in the disc device 18a through the central processing unit 13a, the multi-bus 11a and the disc controller 17a and is transferred also to the computer 2 side through the communication controller 19a and the MODEM 20a.

On the contrary, the data received from the computer 2 side is stored, displayed and processed through the route opposite to the one described above. The data received through the MODEM 20b and the communication controller 19b on the computer 2 side is stored in the main memory device 14b through the central processing unit 13b one hand, and the data on the main memory device 14b is stored in the disc device 18b through the central processing unit 13b, the multi-bus 11b and the disc controller 17b, on the other.

The hardware configuration is such as described above, and the software configuration will be explained next. As shown in FIG. 11, the system includes, on the main memory device 14a on the work station 1 side, a data input processing unit 21, a program storage controlling unit 22, an analysis execution controlling unit 24, an analysis result storage controller 26, a trade-off evaluation unit 28, a result display processing unit 30, a display specification retaining unit 32, a display controller 34 and an output file controller 36, and includes, on the main memory device 14b on the computer side 2, another analysis system 38.

Figure 13B:
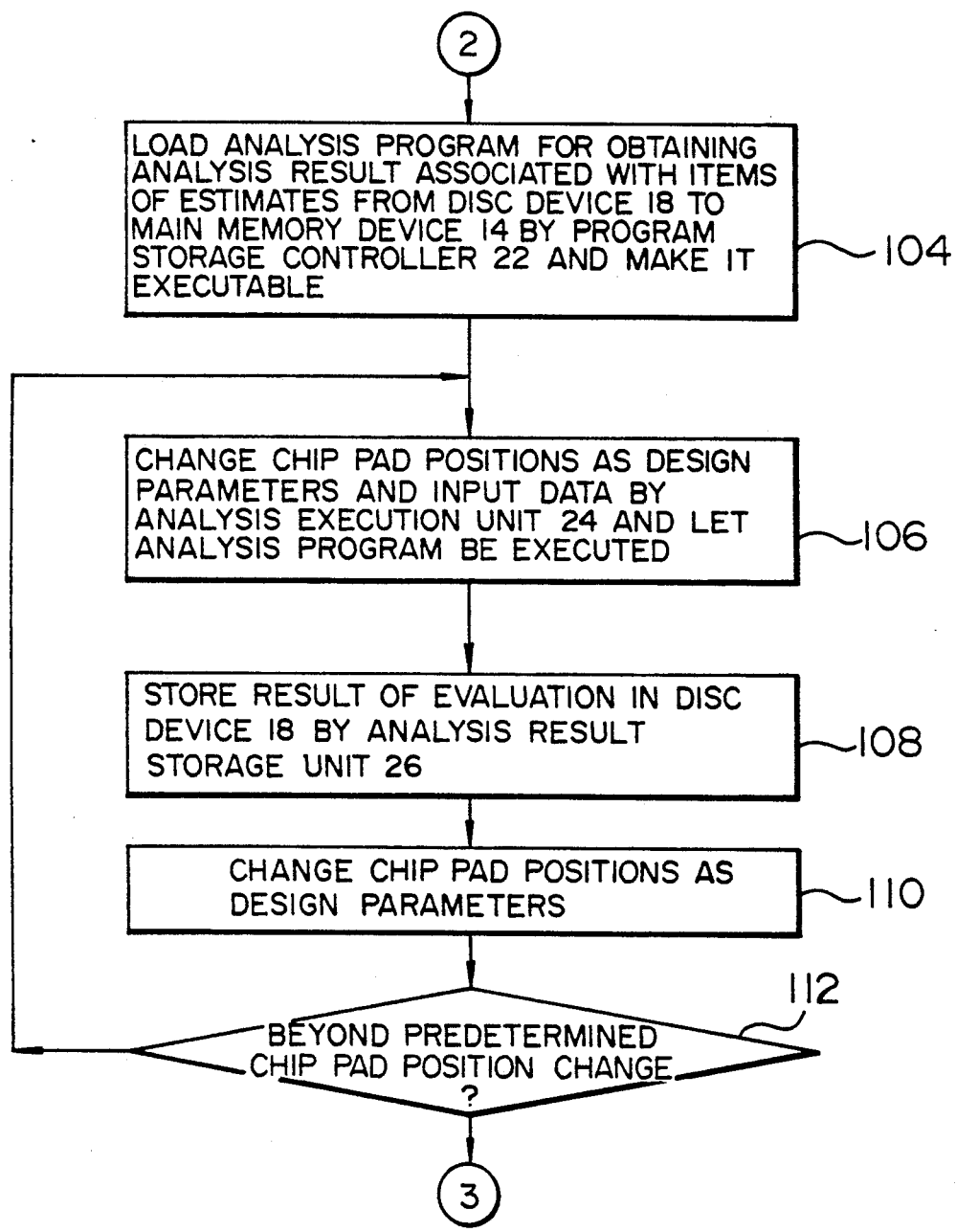
FIGS. 13A, 13B and 13C are block diagrams showing the outline of the processing sequence in another embodiment of the present invention wherein part of analysis result is acquired from another analysis system.
Figure 13:
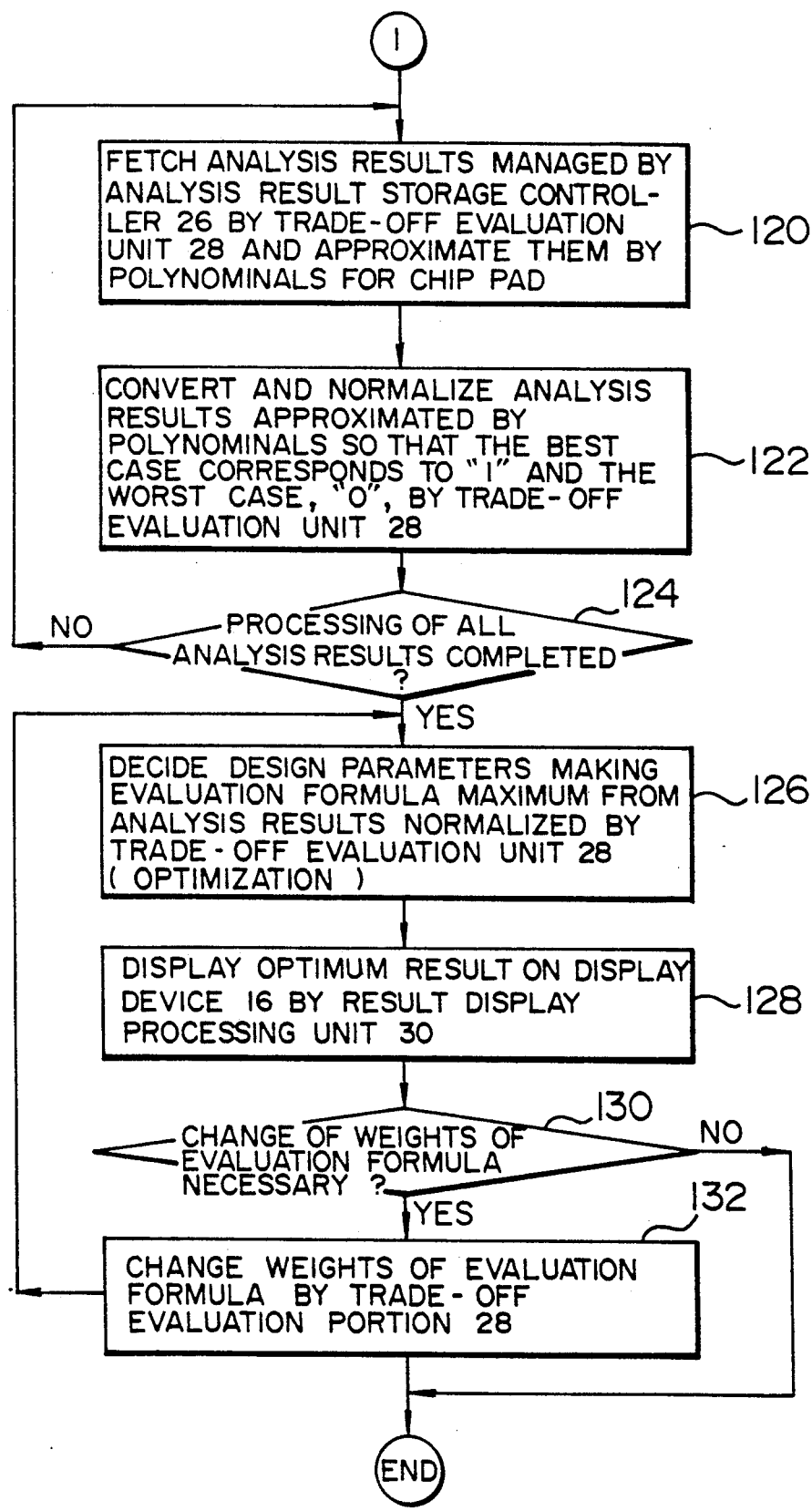

Next, the case where part of the analysis result is acquired from another analysis system when the product specification complex analysis system of the present invention is applied to the design of the plastic-encapsulated package of semiconductor devices will be explained with reference to FIGS. 13A to 13C. This embodiment assumes the case where the tap positions of the plastic-encapsulated package of semiconductor devices are designed, in the same way as in the aforementioned embodiments.

The operator inputs the data such as the package shape, the frame shape, the molding condition, the material characteristics, the gold wire position, the change range of the tab positions, the items of the estimates, and so forth, through the keyboard 15 in the same way as in the foregoing embodiments, and these data are taken into the complex analysis system as the external input data from the data input processing unit 21 (processing 200). Next, the program storage controlling unit 22 judges the necessary analysis program from the inputted items of the estimates on the basis of the instruction from the analysis execution controller 24 and at the same time, judges whether or not such a program exists inside the group of the analysis programs managed by the controller 22 by itself on the disc device 18a. If such a program does not exist, the program storage controller 22 judges it necessary to utilize another analysis system (processings 202, 203). The input display specification of another analysis system is selected from the group of the display specifications managed on the disc device 18a for obtaining the necessary analysis result under the control of the display specification retaining unit 32 on the basis of the judgement described above. The selected specification is then transferred to the main memory device 14a through the disc controller 17a, the multi-bus 11a and the central processing unit 13a (processing 204).

The display controller 34 generates the input display data required by another analysis system under the operable state from the input display specification on the main memory device 14a on the basis of the data inputted to the data input processing unit 20 such as the package shape, the frame shape, the molding condition, the material characteristics, the gold wire position, the change range of the chip pad positions, and so forth. These input display data are generated on the main memory device 14a (processing 206). Then, the display controller 34 delivers the generated input display data to another analysis system 38 through the central processing unit 13a, the multi-bus 11a, the communication controller 19a, the MODEMs 20a and 20b, the communication controller 19b, the multi-bus 11b, the central processing unit 13b and the main memory device 14b. Thereafter the display controller 34 activates another analysis system 38 and lets it execute the analysis (processing 208). After the execution of processing by another analysis system 38 is completed, the output file controller 36 loads to the main memory device 14a only the necessary part of the analysis results among the execution result by another analysis system 38, through the central processing unit 13b, the multi-bus 11b, the communication controller 19b, the MODEMs 20b and 20a, the communication controller 19a, the multi-bus 11a and the central processing unit 13a (processing 210). The output file controller 26 edits and converts the analysis result into a predetermined storage format, and the result is then stored in the disc device 18a by the analysis result storage controller 26 through the central processing unit 13a, the multi-bus 11a and the disc controller 17a (processing 212). The analysis execution unit 24 includes the processings 204 to 112 within its operations until the analysis result designated by the inputted items of the estimates is completed, and a series of processings from 202 to 212 are executed repeatedly (processing 214).

After all the analysis results necessary for the estimates are stored in the disc device 18a in the way described above, the processing procedures (processings 120 to 132) illustrated in the foregoing embodiments are executed by the trade-off evaluation unit 28 and by the result display processing unit 30, and in this manner, the optimum tab positions can be designed.

As described above, the embodiment makes it possible to easily conduct the complex analysis by utilizing an arbitrary analysis system besides the analysis system of its own when the design of the plastic-encapsulated package of semiconductor devices is carried out.

In the embodiment described above, the method of acquiring the data of the material characteristics of the product is described in JP-A-2-328708. These data are in advance inputted to the system as typified by processing 102.

As described above, according to claim 1 of the appended claims of this invention, the product specifications can be determined to the optimum values by the collective judgement based on the analysis results obtained from at least two, different aspects. According to claim 4 of the appended claims, the product specifications can be set to the optimum values by the collective judgement based on the analysis results obtained at least from the aspects of reliability of the product specification, processability during production and its operability. According to claim 5, further, data processing for conducting the complex analysis can be facilitated and the product specifications can be set to the optimum values by the collective judgement based on the analysis results obtained from at least two kinds of different aspects. Furthermore, according to claims 6 and 7, data processing for conducting the complex analysis can be facilitated and the product specifications can be set to the optimum values by the collective judgement based on the analysis results exceeding the common scale and obtained from at least two kinds of different aspects. According to claim 8, data processing for conducting the complex analysis can be facilitated and the product specifications can be set to the optimum values by the flexible and collective judgement based on the analysis results exceeding the common scale and obtained at least from the aspects of reliability of the product specifications, processability during production and its operability.

According to claim 10 of the invention, the product specifications can be set to the optimum values even when the analysis result for a certain item of the estimate cannot be obtained from the analysis system of its own. According to claim 11, data processing for conducting the complex analysis can be facilitated even when the analysis result for a certain item of the estimate cannot be obtained by the analysis system of its own and the produce specifications can be set to the optimum values by the flexible and collective judgement based on the analysis results exceeding the common scale and obtained at least from the aspects of reliability of the product specifications, processability during production and its operability.

We claim:

1. A product specification complex analysis system comprising:
    means for inputting product specifications, design parameters determined by analysis and evaluation of said specifications, the range of changes of said parameters, and a plurality of items to be estimated;
    memory means for storing evaluation programs corresponding to said items to be estimated, respectively;
    means for obtaining analysis results corresponding to the changes of said design parameters within designated ranges of changes by executing said evaluation program called from said memory means; and
    means for evaluating a trade-off between said plurality of analysis results by changing said design parameters by the use of predetermined evaluation functions on the basis of said plurality of analysis results corresponding to said plurality of items to be estimated, and for thus obtaining optimum design parameters.

2. A product specification complex analysis system according to claim 1, wherein said product specification is a specification relating to an external form and materials of a product.

3. A product specification complex analysis system according to claim 1, wherein said predetermined evaluation functions are estimate functions with weights including said plurality of analysis results corresponding to said plurality of items of the estimates, and optimum parameters are obtained by determining design parameters giving the greatest values of evaluation values of said estimate functions with weights.

4. A product specification complex analysis system according to claim 1, wherein said items of the estimates are items relating to reliability of product specification, processability during production and operability of production.

5. A product specification complex analysis system comprising:
    means for inputting product specifications, design parameters determined by analysis and evaluation of said specifications, the range of changes of said parameters, and a plurality of items to be estimated;
    memory means for storing evaluation programs corresponding to said items to be estimated, respectively;
    means for obtaining analysis results corresponding to the changes of said design parameters within designated ranges of changes by executing said evaluation program called from said memory means; and
    means for effecting polynominal approximation of said analysis results, evaluating a trade-off between said plurality of analysis results by changing said design parameters by the use of predetermined evaluation functions on the basis of said plurality of items to be estimated, and for thus obtaining optimum design parameters.

6. A product specification complex analysis system comprising:
    means for inputting product specifications, design parameters determined by analysis and evaluation of said specifications, the range of changes of said parameters, and a plurality of items to be estimated;

memory means for storing evaluation programs corresponding to said items to be estimated, respectively;

means for obtaining analysis results corresponding to the changes of said design parameters within designated ranges of changes by executing said evaluation program called from said memory means; and means for effecting polynominal approximation of said analysis results, whereby said plurality of analysis results thus subjected to polynominal approximation and corresponding to said items of the estimates are so normalized as to fall within the ranges of specific values, respectively, for evaluating a trade-off between said plurality of analysis results by changing said design parameters by the use of predetermined evaluation functions on the basis of said plurality of normalized analysis results, and for thus obtaining optimum design parameters.

7. A product specification complex analysis system according to claim 6, wherein said normalization is so effected as to fall within the zone of [0, 1], and said evaluation results are converted to "1" and "0" in the best and worst cases, respectively.

8. A product specification complex analysis system according to claim 7, wherein the relationship between said evaluation results and a defect ratio is determined on the basis of defect data of existing products, the best and worst ones of said evaluation results are converted to "1" and "0", respectively, in such a manner as to correspond to the minimum and maximum values of said defect ratio, respectively, and optimum design parameters are determined by the use of the sum of said defect ratio in each of defect modes associated with said analysis results as weighting coefficients of estimate functions.

9. A product specification complex analysis system according to claim 8, wherein said items of the estimates are evaluation items associated with reliability of product specifications, processability during production and operability of production.

10. A production specification complex analysis system comprising:

means for inputting product specifications, design parameters determined by analysis and evaluation of said specifications, the range of changes of said parameters, and a plurality of items to be estimated;

memory means for storing evaluation programs corresponding to said items to be estimated, respectively;

means for obtaining analysis results corresponding to the changes of said design parameters within designated ranges of changes by executing said evaluation program called from said memory means; and means for evaluating a trade-off between said plurality of analysis results by changing said design parameters by the use of predetermined evaluation functions on the basis of said plurality of analysis results corresponding to said plurality of evaluation items, and for thus obtaining optimum design parameters, wherein, when said evaluation programs corresponding to said items of the estimates do not exist in said memory means, the data necessary for the analysis of said items of the estimates are analyzed by another external analysis system capable of analyzing said items of the estimates, and the results of said analysis are inputted as said analysis results corresponding to said items to be estimated to said means for obtaining the optimum design parameters.

11. A production specification complex analysis system according to claim 10, wherein said analysis results are subjected to polynominal approximation and are so normalized as to fall within the zone of [0, 1], and are converted to "1" and "0" in such a manner as to correspond to the best and worst ones of said evaluation results, respectively.

12. A product specification complex analysis system according to claim 11, wherein the relationship between said evaluation results and a defect ratio is determined on the basis of defect data of existing products, the best and worst ones of said evaluation results are converted to "1" and "0", respectively, in such a manner as to correspond to the minimum and maximum values of said defect ratio, respectively, and optimum design parameters are determined by the use of the sum of said defect ratio in each of defect modes associated with said analysis results as weighting coefficients of estimate functions.

* * * * *